United States Patent [19]

Suzuki

[11] 4,010,486

[45] Mar. 1, 1977

[54] SENSING CIRCUITS
[75] Inventor: Sadao Suzuki, Tokyo, Japan
[73] Assignee: Sony Corporation, Tokyo, Japan
[22] Filed: Apr. 25, 1975
[21] Appl. No.: 571,688
[30] Foreign Application Priority Data
May 10, 1974 Japan .............................. 49-52116
[52] U.S. Cl. .................................. 357/25; 357/23; 357/27; 357/28; 357/38; 307/299 R; 307/308
[51] Int. Cl.² .................. H01L 29/66; H01L 27/22; H01L 29/74; H03K 3/26
[58] Field of Search ................... 357/23, 25, 27, 28, 357/38, 43; 307/299, 308 T

[56] References Cited
UNITED STATES PATENTS

| | | | |
|---|---|---|---|
| 3,204,160 | 8/1965 | Sah ....................................... | 357/38 |
| 3,600,650 | 8/1971 | Obenhaus et al. ..................... | 357/38 |
| 3,641,404 | 2/1972 | Per ....................................... | 357/38 |
| 3,668,439 | 6/1972 | Fujikawa et al. ...................... | 357/38 |

FOREIGN PATENTS OR APPLICATIONS 906,036  9/1962  United Kingdom ................. 357/89

Primary Examiner—Edward J. Wojciechowicz
Attorney, Agent, or Firm—Hill, Gross, Simpson, Van Santen, Steadman, Chiara & Simpson

[57] ABSTRACT

A sensing circuit for detecting a change in a normal characteristic of an object such as a change in a normal temperature characteristic, a change in a normal magnetic field characteristic, or a change in a normal light falling on the sensing element of the sensing circuit is provided. The circuit employs a four-terminal semiconductor device having alternate layers of conductivity type, which has an amplification characteristic of the collector current to the base-emitter grounded, wherein there is a sharp decrease in the $h_{FE}$ amplification characteristic at one value of gate to emitter voltage. This point represents the point in which the semiconductor device is biased for a normally desired characteristic being sensed. Whenever there is a deviation from this normal position, there is a sharp rise in the $h_{FE}$ irrespective of what the direction of deviation is. The $h_{FE}$ gain then substantially levels off.

7 Claims, 7 Drawing Figures

SENSING CIRCUITS

BACKGROUND OF THE INVENTION

Field of the Invention

This invention relates to a sensing device for detecting the changes in a normal characteristic of an object or condition.

BRIEF SUMMARY OF THE INVENTION

A sensing circuit is provided for detecting a change in a normal desired characteristic of an object or condition being examined which includes a semiconductor device comprising a first semiconductor region of one conductivity type, a second semiconductor region of the opposite conductivity type adjacent said first region with a first semiconductor junction therebetween, a third semiconductor region of the same conductivity type as said first region adjacent said second region with a second semiconductor junction therebetween, first, second and third terminals coupled to said first, second and third regions, respectively, a fourth terminal connected to said semiconductor device and having at least a portion thereof located adjacent to said first region at a position which is spaced from the said first terminal, and an insulating layer separating said fourth terminal from said first region. A sensing element is inserted in either the biasing circuit of the fourth terminal or the biasing circuit of the second terminal. The output of the semiconductor device is arranged to be examined to determine a change in the potential of the third terminal of the semiconductor device.

DESCRIPTION OF THE PREFERRED EMBODIMENTS

Figure 1:
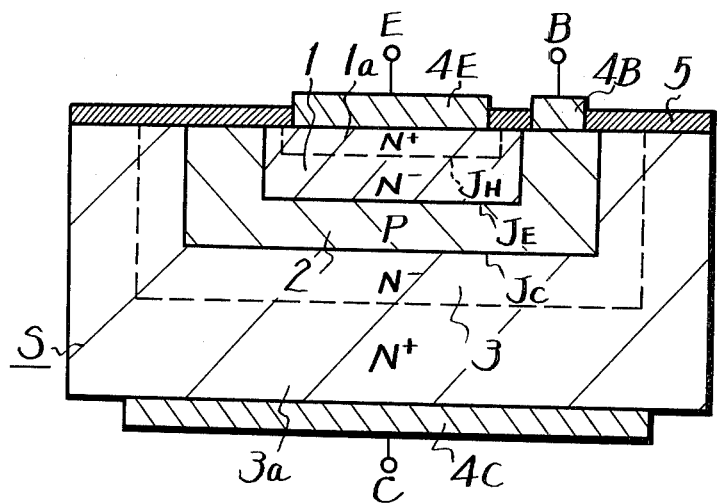
FIGS. 1 and 2 are, respectively, cross sectional views of a three-terminal semiconductor device used for explaining the four-terminal semiconductor device of the present invention.

The novel semiconductor device of the present invention has a high current amplification factor and good saturation characteristics as compared with a prior art bipolar transistor such as a MOS FET. The semiconductor device of the present invention is a four-terminal device. In order to better appreciate the nature and characteristics of the four-terminal device, a description will first be made of two novel semiconductor devices which are disclosed in application Ser. Nos. 427,648 and 427,647, and which are assigned to the same assignee as the present invention. Referring to the semiconductor devices illustrated in FIGS. 1 and 2, the emitter-grounded current amplification factor $h_{FE}$ of a transistor, which is one of the parameters for evaluating the characteristics of the bipolar transistor, can be expressed by the following equation (1), if the base-grounded current amplification factor of the transistor is taken as $\alpha$.

$$h_{FE} = \frac{\alpha}{1-\alpha} \tag{1}$$

The factor $\alpha$ is expressed as follows:

$$\alpha = \alpha^* \beta \gamma \tag{2}$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} \cdot \frac{1}{1 + \frac{J_p}{J_n}} \tag{3}$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{qD_n n_p}{L_n} \left\{ \exp\left(\frac{qV}{kT}\right) - 1 \right\} \tag{4}$$

$$J_p = \frac{qD_p p_n}{L_p} - \left\{ \exp\left(\frac{qV}{kT}\right) - 1 \right\} \tag{5}$$

the ratio of $J_n$ and $J_p$ is expressed as follows:

$$\delta \equiv \frac{J_p}{J_n} = \frac{L_n}{L_p} \cdot \frac{D_p}{D_n} \cdot \frac{P_n}{n_p} \tag{6}$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carriers in the emitter under the equilibrium state; V a voltage applied to the emitter junction of the transistor; k the Boltzmann's constant; T temperature; and q the absolute value of electron charge.

If it assumed that the impurity concentration in the emitter of the transistor is taken as $N_D$ and that in the base of the transistor taken as $N_A$, the term $P_n/n_p$ can be replaced by the term $N_A/N_D$. Further, since $L_n$ is restricted by the base width W and $L_n = W$, the ratio $\delta$ is expressed as follows:

$$\delta = \frac{W}{L_p} \cdot \frac{D_p}{D_n} \cdot \frac{N_A}{N_D} \quad (7)$$

The diffusion constants $D_n$ and $D_p$ are functions of transfer of the carrier and temperature and in this case they are assumed constant substantially.

As may be obvious from the above respective equations, in order to increase the current amplificaton factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atoms/cm$^3$, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = \sqrt{D_p \tau_p} \quad (8)$$

the diffusion distance $L_p$ of the minority carriers or holes becomes short. Therefore, as may be apparent from the equation (7), $\delta$ can not be made small so much and hence the injection efficiency $\gamma$ can not be made high over a certain value. As a result, the current amplification factor $h_{FE}$ can not be made high so much in the ordinary transistor.

The novel three-terminal semiconductor device is free from the defects mentioned just above inherent to the prior art transistor. As the semiconductor device used in this invention, an NPN-type one and a PNP-type one could be considered as in the case of the prior art transistor, but an NPN-type semiconductor device will be now described with reference to FIGS. 1 and 2, by way of example.

As shown in FIG. 1, the NPN-type three-terminal semiconductor device consists of a first semiconductor region 1 of N$^-$ type conductivity formed in a semiconductor substrate S of N$^+$ type conductivity, a second semiconductor region 2 of P type conductivity formed in the semiconductor substrate S adjacent the first region 1, and a third semiconductor region 3 of N$^-$ type conductivity formed in the substrate S adjacent the second region 2 to form a first PN-junction $J_E$ between the first and second regions 1 and 2 and a second PN-junction $J_c$ between the second and third regions 2 and 3, respectively.

With the semiconductor device as shown in FIG. 1, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, or at least the heat energy kT of holes (approximated as kT where T is the device temperature) is formed in the first region 1. In the example of FIG. 1, the impurity concentration in the first region 1 is selected low sufficiently such as in the order of $10^{15}$ atoms/cm$^3$ and region 1a of N$^+$ type conductivity or the impurity concentration of about $10^{19}$ atoms/cm$^3$ is formed in the first region 1 to form an LH-junction and hence to form the barrier.

The impurity concentration in the second region 2 is selected in the order of $10^{15}$ to $10^{17}$ atoms/cm$^3$ and that in the third region 3 is selected sufficiently low, such as in the order of $10^{15}$ atoms/cm$^3$.

In the semiconductor substrate S adjacent to the third region 3 but apart from the second junction $J_c$, there is formed a region 3a of N$^+$ type conductivity and with the impurity concentration of about $10^{19}$ atoms/cm$^3$.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith, respectively. From these electrodes 4E, 4B and 4C, there are led out first, second and third terminals E, B and C, respectively. In FIG. 1, reference numeral 5 indicates an insulating layer made of, for example, SiO$_2$ and formed on the surface of the substrate S.

The semiconductor device shown in FIG. 1 can be used as a transistor. In such a case, the first region 1 serves as an emitter region; the second region 2 as a base region; and the third region 3 as a collector region, respectively, a forward bias is applied to the emitter junction $J_E$ and a reverse bias is applied to the collector junction $J_C$.

Thus, the holes injected from the base or the second region 2 to the emitter or first region 1 have a long life period of time due to the fact that the emitter region 1 has the low impurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate S and may be recombined with electrons on the surface in practice, the diffusion distance $L_p$ could not be made substantially long. With the semiconductor device shown in FIG. 1, since the potential barrier is formed in the emitter region 1, which potential barrier faces the emitter junction $J_E$, at the position with a distance smaller than the diffusion distance $L_p$ of the minority carrier, the amount of the surface recombination is reduced and the diffusion distance $L_p$ can be taken long sufficiently.

Due to the fact that the potential barrier is formed as described above in the example shown in FIG. 1, there is performed such an effect that the current density or component $J_p$ of the holes injected from the base region 2 to the emitter region 1 is reduced. That is, on the LH-junction $J_H$ in the emitter region 1, there is caused a false Fermi level difference or built-in electric field which acts to suppress the diffusion of the holes or the minority carrier. Therefore, if the level of the Fermi level is sufficiently high, the diffusion current caused by the concentration gradient of holes and the drift current caused by the built-in electric field are cancelled on the LH-junction with each other to reduce the hole current $J_p$ injected from the base 2 through the emitter region 1 of low impurity concentration. By this effect, the ratio of electron current arriving at the collector region 3 relative to current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy of the holes. The heat energy of the holes can be approximated as $kT$, but the above level difference is desired to be more than 0.1 eV. Within the transition region of the potential, the diffusion distance $L_p$ of the holes must be not terminated within the transition region, or it is required that the diffusion distance $L_p$ of the hole must be greater than the width of the transition region.

In the case that the LH-junction $J_H$ is formed as shown in FIG. 1, the potential barrier of 0.2 eV can be formed by suitably selecting the amount of impurity and gradient of the high impurity concentration region 1a.

Figure 2:
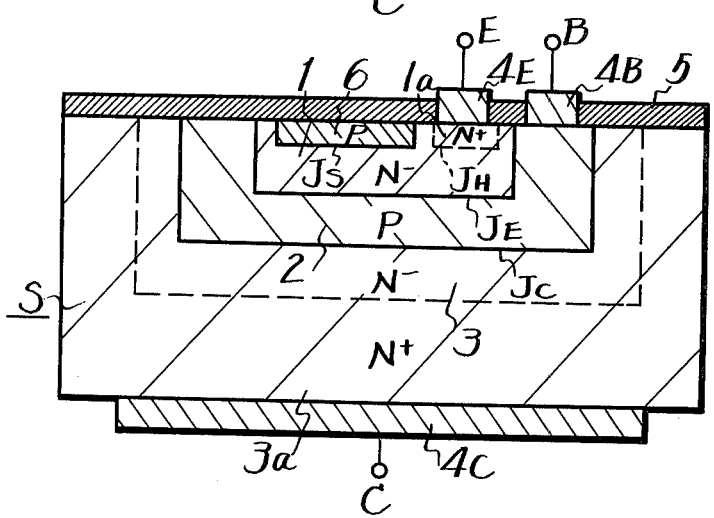

FIG. 2 shows another example of the three-terminal semiconductor device in which reference numerals and letters which are the same as those used in FIG. 1 indicate the same parts, so that their description will be omitted.

In the example of FIG. 2, in order to form a PN-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_p$ of the minority carrier in the first region 1. The other construction of the example shown in FIG. 2 is substantially the same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from electrical point of view, its potential is increased as the number of holes arriving at the additional region 6 is increased. Thus, the PN junction $J_S$ formed between the regions 6 and 1 is biased forwardly to its rising-up voltage substantially, and then holes will be re-injected to the first region 1 from the additional region 6. Thus, the concentration of holes in the first region 1 near the additional region 6 will be increased, and accordingly, the concentration distribution of holes between the junctions $J_E$ and $J_S$ in the first region 1 is made uniform and the gradient thereof becomes gradual to reduce the diffusion current $J_p$ from the second region 2 to the first region 1.

If, in the semiconductor devices described above, a fourth region or control region is formed in the first region 1 thereof and a fourth electrode or control electrode (gate) is connected thereto so as to form a novel four-terminal semiconductor device, its current amplification factor may be varied by applying a control voltage to the control electrode (gate).

Figure 3:
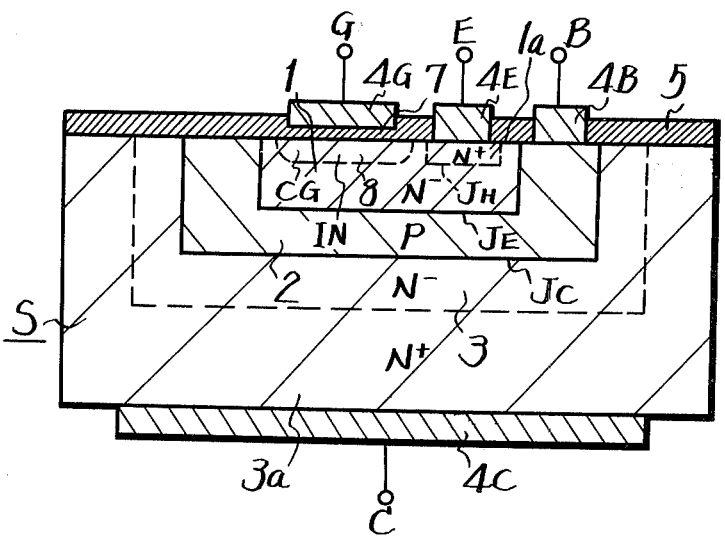
FIG. 3 is a cross-sectional view of a preferred embodiment of the novel four-terminal semiconductor device of the present invention.

A description will now be given of the novel four-terminal semiconductor device which is employed in the present invention. With reference to FIG. 3, a control electrode (gate) is formed over a surface of the first semiconductor region 1 (emitter region) of the semiconductor device of the three-terminal type shown in FIG. 1 on an insulating layer.

In the embodiment of FIG. 3, a control electrode 4G such as a metal layer made of, for example, aluminum and having a predetermined area is formed over a part of the first semiconductor region (emitter region) 1 of the device shown in FIG. 1 on an insulating layer (gate insulating layer) 7 which has a predetermined thickness, for example, 100 A(angstrom), and is made of, for example, SiO$_2$ similar to the insulating layer 5, and corresponds to the gate insulating layer of a MOS FET. A gate terminal G is led out from the control electrode 4G as a fourth terminal. A part 8 in the first region 1 opposing the control electrode 4G is the semiconductor control region.

If a gate bias voltage is applied between the gate and emitter of the four-terminal semiconductor device or the gate terminal G and the emitter terminal E, the current amplification factor or emitter-grounded current amplification factor $h_{FE}$ thereof is varied in response to the gate bias voltage along a curve which is convex in the downward direction and substantially symmetrical with respect to its minimum value. In other words, if a bias voltage which is negative relative to the emitter terminal E in the device of FIG. 3, within the positive range from the threshold voltage of the bias voltage, a storage layer CG having the function similar to the LH-junction $J_H$ as the potential barrier in FIG. 1 is formed in a part of the first region (emitter region) 1 as the voltage approaches the positive direction. Thus, the current density $J_p$ of the holes of the diffusion current from the second region (base region) 2 to the first region (emitter region) 1 decreases, and consequently the factor $h_{FE}$ increases.

While, within the negative region from the threshold voltage of the bias voltage, an inverse layer IN is formed in a part of the emitter region 1 or control region 8 as the voltage approaches the negative direction and, similar to the case where the additional region 6 in FIG. 2 is floated in the electrical point of view, holes are re-injected from the inverse layer IN to the emitter region 1. Thus, the current density $J_p$ of the holes of the diffusion current from the base region 2 to the emitter region 1 decreases, and consequently the factor $h_{FE}$ increases.

Figure 4:
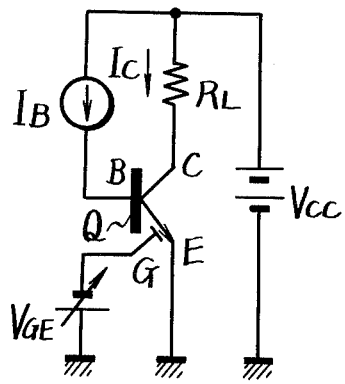
FIG. 4 is a circuit diagram of a circuit used for measuring the characteristics of a novel four-terminal device shown in FIG. 3.
Figure 5:
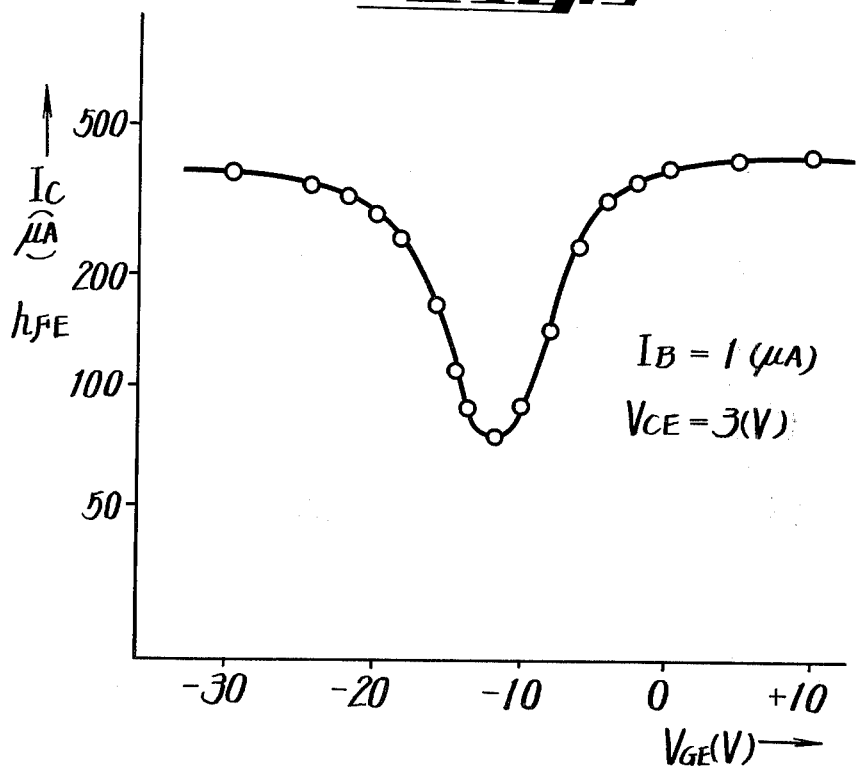
FIG. 5 is a graph showing the characteristics of the four-terminal semiconductor device of FIG. 3, wherein the collector current in micro amperes is plotted against the voltage between the gate and the emitter of the semiconductor device.

FIG. 5 is a graph showing the characteristics of the novel four-terminal semiconductor device shown in FIG. 3 which is measured by a measuring circuit shown in FIG. 4.

In FIG. 4, reference letter Q indicates the novel four-terminal semiconductor device shown in FIG. 3 as a symbol, in which a short line is added to the symbol of the prior art bipolar transistor in parallel to its emitter as the gate of the novel four-terminal semiconductor device Q. In FIG. 4, the novel four-terminal semiconductor device Q is shown as an emitter-grounded type. In the figure, reference letter $R_L$ indicates a collector load resistor of the device Q, $V_{CC}$ its collector voltage source, $I_C$ its collector current, $I_B$ its base current (constant), and $V_{GE}$ its gate-emitter voltage, respectively.

When its collector-emitter voltage $V_{CE}$ is 3V (volts) and the base current $I_B$ is 1 $\mu$A (micro-ampere), the characteristics of the gate-emitter voltage (gate bias voltage) $V_{GE}(V)$ - collector current $I_C(\mu A)$ and emitter-grounded current amplification factor $h_{FE}$ are shown in the graph of FIG. 5.

According to the characteristic curve of FIG. 5, it may be understood that the current amplification factor $h_{FE}$ is varied in response to the variation of the gate bias voltage along a curve which is convex in the downward direction and approximately symmetrical with respect to its minimum value (where the gate-emitter voltage is at the above threshold voltage).

When the thickness of the emitter region 1 of the semiconductor device shown in FIG. 3 is selected smaller than the diffusion distance $L_p$ of the holes (injected carriers), the surface recombination, where the gate-emitter voltage $V_{GE}$ is substantially equal to the threshold voltage, is greatly influenced. Thus, the life time period of the injected carrier (minority carrier) becomes short, and accordingly, the minimum value of the factor $h_{FE}$ can be made smaller.

The embodiment shown in FIG. 3 is an NPN type element, but it may, of course, be possible that the semiconductor device be made as a PNP type, as in the case of a bipolar transistor.

Figure 6:
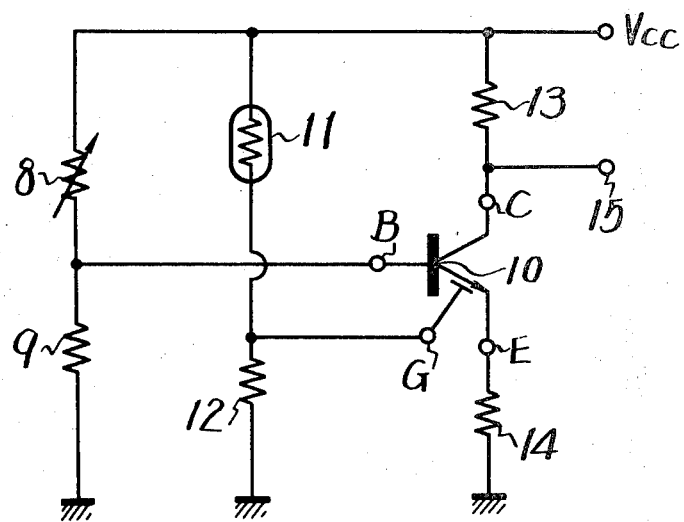
FIG. 6 is a circuit diagram of a sensing device employing the novel four-terminal semiconductor device and in which the sensing element is in the fourth terminal biasing circuit.

Referring now to FIG. 6, the sensing circuit comprises a semiconductor device 10 of the type illustrated in FIG. 3. This device has its collector C connected to a potential source $V_{CC}$ through a resistor 13. Its emitter E is connected through a resistor 14 to ground. The base B of the device 10 is connected through a variable resistor 8 to the potential source $V_{CC}$ and is also connected to ground through the resistor 9. The resistors 8 and 9 thus provide a voltage divider network in which the biasing level of the base B of the device 10 may be varied by the adjustable resistor 8. The sensing element 11 is an element whose resistance changes as a function of the condition to be examined. It may thus be one whose resistance varies as a function of light, as a function of magnetic field, or as a function of temperature. This sensing element 11 is connected on one side to the potential source $V_{CC}$ and on the other side to the resistor 12 which in turn is connected to ground. The mid-point between element 11 and resistor 12 is connected to the gate electrode G of the semiconductor device 10. The output 15 is connected to the collector C of the device 10.

The biasing level of the device 10 is adjusted so that under the normal condition of the object being sensed, the $I_C/I_B$ is minimum. This represents the low point in the curve shown in the graph in FIG. 5. Thus, when the condition being sensed changes from normal, the emitter grounded amplification gain changes rapidly either to the right or to the left of the low point of the graph, but then nearly levels off. This sensing circuit is very sensitive to a change in the sensed characteristic. This type of a semiconductor device is thus very different from the use of a MOS FET or the like, in which the change would be quite gradual and thus not give a critical indication of a small change.

Figure 7:
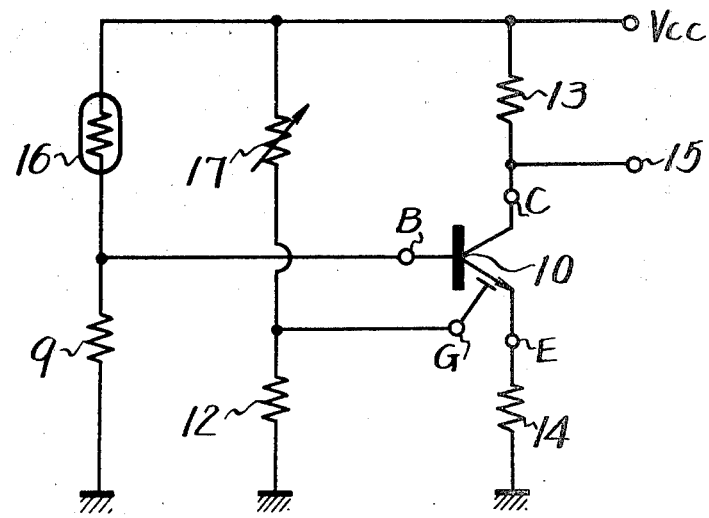
FIG. 7 is a circuit diagram of another embodiment of the present invention, in which the sensing element is in the biasing circuit of the base of the semiconductor device.

FIG. 7 is similar to FIG. 6, with the exception that the temperature sensing element 16 is inserted in the biasing circuit of the base B of the device 10. The adjustable resistor 17 is inserted in the gate biasing circuit of the device 10. Otherwise, the circuit is similar to FIG. 6.

It will be apparent to those skilled in the art that many modifications and variations may be effected without departing from the spirit and scope of the novel concepts of the present invention.

I claim as my invention:

1. A sensing circuit for detecting a change in a characteristic of an object comprising a semiconductor device having a first semiconductor region of one conductivity type forming an emitter region, a second semiconductor region of the opposite conductivity type forming a base region adjacent said first region with a first semiconductor junction therebetween, a third semiconductor region of the same conductivity type of said first region forming a collector region adjacent said second region with a second semiconductor junction therebetween, an insulating layer on the outer surface of said emitter region, a gate electrode on said insulating layer forming a gate over said emitter region only, said semiconductor device having an emitter grounded current amplification variation in response to changes in voltage between said emitter region and said gate, said variation exhibiting a minimum value at a first voltage between said emitter region and gate and an increasing value for voltages higher and lower than said first voltage, an output circuit connected to said collector region, a base bias circuit connected to said base region, a gate bias circuit connected to said gate, one of said bias circuits including a sensing element for detecting the change in characteristic of said object and the other bias circuit including a bias adjustment element, whereby a change in the object characteristic creates a variation in the current amplification which changes a voltage level in the output circuit.

2. A sensing circuit according to claim 1, in which said first and third regions of the semiconductor device each have at least a first portion adjacent the second region with impurity concentrations of substantially the same order of magnitude and said first region being provided with a second portion spaced from said second region by said first portion having an impurity concentration higher than said first portion of the first region at a position spaced from said first junction by a distance which is smaller than the diffusion distance of the minority carriers.

3. A sensing circuit according to claim 1, in which said sensing element detects a change in temperature.

4. A sensing circuit according to claim 1, in which the sensing element detects a change in the magnetic field characteristics of the object.

5. A sensing circuit according to claim 1, in which the sensing element detects a change in light.

6. A sensing circuit according to claim 1, in which said sensing element is included within said gate bias circuit.

7. A sensing circuit according to claim 1, in which the sensing element is included within said base bias circuit.

* * * * *